(12) United States Patent
Heo et al.

(10) Patent No.: US 11,699,765 B2
(45) Date of Patent: Jul. 11, 2023

(54) SEMICONDUCTOR DEVICE

(71) Applicant: Samsung Electronics Co., Ltd., Suwon-si (KR)

(72) Inventors: Jinseong Heo, Seoul (KR); Taehwan Moon, Suwon-si (KR); Hagyoul Bae, Hanam-si (KR); Seunggeol Nam, Suwon-si (KR); Sangwook Kim, Seongnam-si (KR); Kwanghee Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/461,034

(22) Filed: Aug. 30, 2021

(65) Prior Publication Data

US 2022/0173255 A1 Jun. 2, 2022

(30) Foreign Application Priority Data

Nov. 27, 2020 (KR) .................. 10-2020-0163338
Mar. 16, 2021 (KR) .................. 10-2021-0034246

(51) Int. Cl.
*H01L 29/86* (2006.01)
*H10K 10/50* (2023.01)
(Continued)

(52) U.S. Cl.
CPC ............ *H01L 29/86* (2013.01); *H10B 69/00* (2023.02); *H10K 10/50* (2023.02); *H10K 19/00* (2023.02); *H10K 19/201* (2023.02)

(58) Field of Classification Search
CPC ....... H01L 29/86; H01L 27/115; H01L 27/28; H01L 27/281; H01L 51/0591;
(Continued)

(56) References Cited

U.S. PATENT DOCUMENTS 8,023,309 B2 9/2011 Tanaka et al.
8,406,032 B2 3/2013 Ahn et al.
(Continued)

FOREIGN PATENT DOCUMENTS

KR 2011-0072921 A 6/2011
KR 2012-0012915 A 2/2012
(Continued)

OTHER PUBLICATIONS

Extended European Search Report dated Apr. 12, 2022 for corresponding European Application No. 21203984.6.
(Continued)

*Primary Examiner* — Samuel Park
(74) *Attorney, Agent, or Firm* — Harness, Dickey & Pierce, P.L.C.

(57) ABSTRACT

A semiconductor apparatus includes a plurality of semiconductor devices. The semiconductor devices each include a ferroelectric layer, a conductive metal oxide layer, and a semiconductor layer, between two electrodes. The conductive metal oxide layer may be between the ferroelectric layer and the semiconductor layer. The ferroelectric layer, the conductive metal oxide layer, and the semiconductor layer may all include a metal oxide. The conductive metal oxide layer may include one or more materials selected from the group consisting of an indium oxide, a zinc oxide, a tin oxide, and any combination thereof.

25 Claims, 11 Drawing Sheets

(51) Int. Cl.
*H10K 19/00* (2023.01)
*H10B 69/00* (2023.01)

(58) Field of Classification Search
CPC ... H01L 27/101; H01L 27/1026; H01L 28/56; H01L 28/55; H10B 69/00; H10B 63/00; H10K 10/50; H10K 19/00; H10K 19/201; H10N 70/841; H10N 70/881; H10N 70/883
See application file for complete search history.

(56) References Cited

U.S. PATENT DOCUMENTS

| | | | |
|---|---|---|---|
| 8,724,368 | B2 | 5/2014 | Kaneko |
| 2014/0203342 | A1 | 7/2014 | Beecher et al. |
| 2018/0018263 | A1* | 1/2018 | Cho .................. H01L 43/08 |
| 2018/0269216 | A1 | 9/2018 | Lee |
| 2019/0181336 | A1* | 6/2019 | Lee ................. H01L 45/1266 |
| 2020/0119047 | A1 | 4/2020 | Yoo et al. |
| 2020/0321344 | A1 | 10/2020 | Ramamoorthy et al. |
| 2020/0411533 | A1* | 12/2020 | Alsmeier ............ G11C 11/2273 |

FOREIGN PATENT DOCUMENTS

| | | | | |
|---|---|---|---|---|
| KR | 2020130770 | A | * 11/2020 | |
| TW | 201631754 | A | * 9/2016 | ............ H01L 29/24 |

OTHER PUBLICATIONS

Lee Hong-Sub et al., "Ferroelectric Tunnel Junction for Dense Cross-Point Arrays", Applied Materials & Interfaces, vol. 7, No. 40, Oct. 14, 2015 (Oct. 14, 2015), pp. 22348-22354, XP055882162.

Material Property Database, 6.777J/2.751J, Material: Indium Tin Oxide (ITO), retrieved Nov. 5, 2021 at www.mit.edu/~6.777/matprops/ito.htm.

Takahira Shiraishi et al., "Impact of mechanical stress on ferroelectricity in $(Hf_{0.5}Zr_{0.5})O_2$ thin films" *Applied Physics Letters*, vol. 108, 2016, pp. 262904-1-262904-5.

Takao Shimizu et al., "The demonstration of significant ferroelectricity in epitaxial Y-doped $HfO_2$ film" *Scientific Reports*, 6:32931, Sep. 2016.

Yingfen Wei et al., "A rhombohedral ferroelectric phase in epitaxially strained $Hf_{0.5}Zr_{0.5}O_2$ thin films" *Nature Materials*, vol. 17, Dec. 2018, pp. 1095-1100.

Herng Yau Yoong et al., "Epitaxial Ferroelectric $Hf_{0.5}Zr_{0.5}O_2$ Thin Films and Their Implementations in Memristors for Brain-Inspired Computing" *Advanced Functional Materials*, vol. 28, 2018, 1806037.

* cited by examiner

SEMICONDUCTOR DEVICE

CROSS-REFERENCE TO RELATED APPLICATIONS

This application is based on and claims priority under 35 U.S.C. § 119 to Korean Patent Application No. 10-2020-0163338, filed on Nov. 27, 2020 in the Korean Intellectual Property Office, and Korean Patent Application No. 10-2021-0034246, filed on Mar. 16, 2021 in the Korean Intellectual Property Office, the disclosure of each of which is incorporated by reference herein in its entirety.

BACKGROUND

1. Field

The inventive concepts relate to semiconductor devices including a ferroelectric layer, a conductive metal oxide layer, and a semiconductor layer, and semiconductor apparatuses including the semiconductor devices.

2. Description of the Related Art

As electronic products tend to be light, thin, and short, the demand for high integration of semiconductor devices has increased. Accordingly, various types of semiconductor devices have been suggested, for example, a semiconductor device including a ferroelectric layer.

SUMMARY

Provided is a semiconductor device capable of low-power driving and having a high degree of integration, and an apparatus including the semiconductor device.

Additional aspects will be set forth in part in the description which follows and, in part, will be apparent from the description, or may be learned by practice of the example embodiments of the inventive concepts.

According to some example embodiments of the inventive concepts, a semiconductor device may include a first electrode, a second electrode isolated from direct contact with the first electrode, a ferroelectric layer, a conductive metal oxide layer, and a semiconductor layer. The ferroelectric layer, the conductive metal oxide layer, and the semiconductor layer may be between the first electrode and the second electrode.

The conductive metal oxide layer may be arranged adjacent to the ferroelectric layer, for example, between the ferroelectric layer and the semiconductor layer.

The semiconductor device may be configured to control a polarization direction of a polarization of the ferroelectric layer according to a direction of an electric field formed between the first electrode and the second electrode. The semiconductor device may be further configured to form a depletion region or an accumulation region in the semiconductor layer according to the polarization direction of the polarization of the ferroelectric layer. The conductive metal oxide layer may be configured to control the crystal direction of the ferroelectric layer without preventing the flow of an electric current in the semiconductor device.

The conductive metal oxide layer may have a crystal direction that is the same as or similar to a desired crystal direction of the ferroelectric layer. For example, the conductive metal oxide layer may have a crystal structure having a (111) and/or (001) crystal direction.

A difference in lattice constant between the ferroelectric layer and the conductive metal oxide layer may be relatively small.

The conductive metal oxide layer may include one or more materials selected from the group consisting of an indium oxide, a zinc oxide, a tin oxide, and any combination thereof. For example, the conductive metal oxide layer may include one or two or more materials selected from the group consisting of an indium gallium zinc oxide (IGZO), an indium tin oxide (ITO), an indium zinc oxide (IZO), a zinc oxide (ZnO), a tin oxide ($SnO_2$), an indium oxide ($In_2O_3$), and any combination thereof.

The conductive metal oxide layer may have an electrical conductivity of equal to or greater than about 100 S/cm.

The ferroelectric layer may include a material represented by $MO_2$, where M is Hf, Zr, or a combination thereof. Furthermore, the ferroelectric layer may include, as a base material, a material expressed as $MO_2$, where M is Hf, Zr, or a combination thereof, and may further include, as a dopant material, as one or two or more materials selected from the group consisting of C, Si, Ge, Sn, Pb, Al, Y, La, Gd, Mg, Ca, Sr, Ba, Ti, Zr, Hf, and a combination thereof.

Furthermore, the ferroelectric layer may include an orthorhombic crystal phase, and may have a crystal structure having a (111) and/or (001) crystal direction. A difference in lattice constant between the conductive metal oxide layer and the ferroelectric layer may be equal to or less than 10%.

The semiconductor layer may include one or more materials selected from the group consisting of Group III-V compound semiconductors, organic semiconductors, metal oxide semiconductors, two-dimensional materials, transition metal dichalcogenides, and quantum dots. For example, the semiconductor layer may include $In_2O_3$, ZnO, $SnO_2$, a vanadium oxide ($VO_2$), a titanium oxide ($TiO_2$), a copper oxide ($Cu_2O$), and/or a tungsten oxide ($WO_3$).

The semiconductor layer may have an energy bandgap equal to or less than about 5.0 eV.

The ferroelectric layer may include, as a base material, a material represented by $MO_2$, where M is Hf, Zr, or a combination thereof.

The ferroelectric layer may further include a dopant material including one or more materials selected from the group consisting of C, Si, Ge, Sn, Pb, Al, Y, La, Gd, Mg, Ca, Sr, Ba, Ti, Zr, Hf, and any combination thereof.

The ferroelectric layer, the conductive metal oxide layer, and the semiconductor layer may each independently have a thickness between about 0.1 nm and about 20 nm.

The semiconductor device may be configured to have a variable resistance having a resistance ratio of 5.0 or more that is generated according to a polarization direction of a polarization of the ferroelectric layer.

The first electrode, the second electrode, or both the first and second electrodes may include a metal, a metal nitride, a metal oxide, or any combination thereof.

The ferroelectric layer, the conductive metal oxide layer, and the semiconductor layer all may include a metal oxide.

The semiconductor device may include a memory element that is configured to store information.

According to some example embodiments, a semiconductor apparatus may include a plurality of first electrode lines on a substrate, the plurality of first electrode lines extending in parallel to an upper surface of the substrate, the plurality of first electrode lines extending in a first direction. The semiconductor apparatus may include a plurality of second electrode lines on the plurality of first electrode lines, the plurality of second electrode lines extending in parallel to the upper surface of the substrate, the plurality of second electrode lines extending in a second direction that is different from the first direction. The semiconductor apparatus may include a first semiconductor device between the plurality of first electrode lines and the plurality of second electrode lines at an intersection of one of the plurality of first electrode lines and one of the plurality of second electrode lines where the one of the plurality of first electrode lines and the one of the plurality of second electrode lines overlap each other in a vertical direction that is perpendicular to the first direction and is perpendicular to the second direction. The first semiconductor device may include the semiconductor device according to any of the example embodiments.

The semiconductor apparatus may further include a plurality of third electrode lines on the plurality of first electrode lines and the plurality of second electrode lines, the plurality of third electrode lines extending in the first direction, and a second semiconductor device between the plurality of second electrode lines and the plurality of third electrode lines at an intersection of the one of the plurality of second electrode lines and one of the plurality of third electrode lines where the one of the plurality of second electrode lines and the one of the plurality of third electrode lines overlap each other in the vertical direction. The second semiconductor device may have a same structure as the first semiconductor device.

According to some example embodiments, a semiconductor apparatus may include a stack structure in which a plurality of insulating layers and a plurality of first electrodes are alternately and repeatedly stacked in a vertical direction, and a cell string including a ferroelectric layer, a conductive metal oxide layer, a semiconductor layer, and a second electrode, wherein the cell string penetrates the stack structure in the vertical direction.

The ferroelectric layer, the conductive metal oxide layer, the semiconductor layer, and the second electrode may extend in the vertical direction through the stack structure, and the second electrode may be at a center portion of the cell string, and the ferroelectric layer, the conductive metal oxide layer, and the semiconductor layer may concentrically surround the second electrode.

The cell string may include a plurality of cell strings isolated from direct contact with each other along a plane of the stack structure, wherein the vertical direction is perpendicular to the plane of the stack structure.

According to some example embodiments, a semiconductor device may include a memory element that is configured to store information, the memory element including a ferroelectric layer; and a selection element electrically connected to the memory element, the selection element configured to perform selection of the semiconductor device based on controlling a flow of an electric current through the memory element, the selection element including a semiconductor layer. The ferroelectric layer and the semiconductor layer may be coupled to each other between two electrodes, and no terminals may be between the ferroelectric layer and the semiconductor layer.

The semiconductor device may further include a conductive metal oxide layer between the ferroelectric layer and the semiconductor layer.

An electronic device may include the semiconductor device and/or semiconductor apparatus according to any of the example embodiments.

According to some example embodiments, a method may include manufacturing a semiconductor device based on forming a first electrode, forming a ferroelectric layer on the first electrode, forming a semiconductor layer on the ferroelectric layer, and forming a second electrode on the semiconductor layer, such that the ferroelectric layer and the semiconductor layer are between the first electrode and the second electrode.

The manufacturing the semiconductor device may include forming a conductive metal oxide layer on the ferroelectric layer, such that the semiconductor layer is formed on the conductive metal oxide layer, the conductive metal oxide layer is between the ferroelectric layer and the semiconductor layer, and the ferroelectric layer, the conductive metal oxide layer, and the semiconductor layer are between the first electrode and the second electrode.

The method may further include manufacturing an electronic device that includes the semiconductor device, based on incorporating the semiconductor device into an assembled processor or memory of the electronic device.

BRIEF DESCRIPTION OF THE DRAWINGS

The above and other aspects, features, and advantages of some example embodiments of the inventive concepts will be more apparent from the following description taken in conjunction with the accompanying drawings, in which.

DETAILED DESCRIPTION

Figure 1:
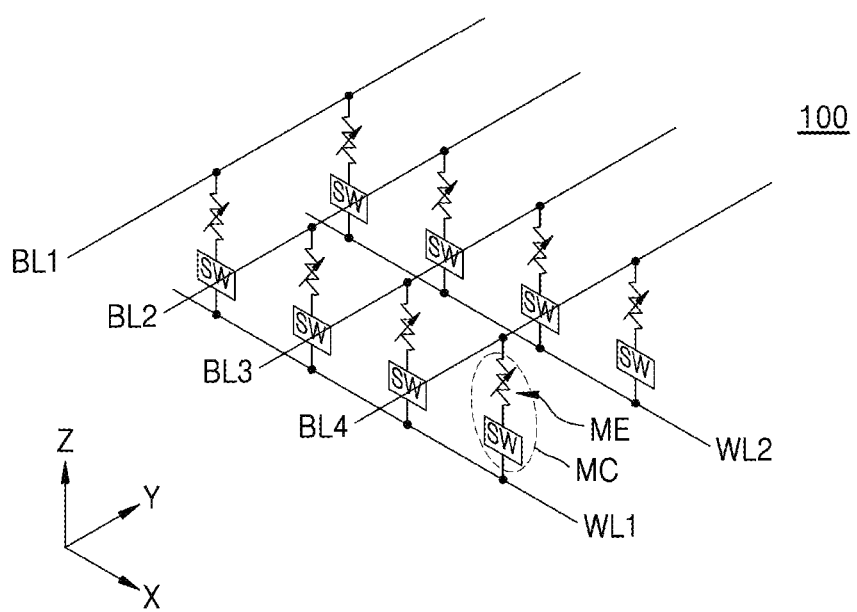
FIG. 1 is an equivalent circuit diagram of a semiconductor apparatus including a plurality of semiconductor devices according to some example embodiments.

Reference will now be made in detail to some example embodiments, some of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Terms used in the specification are used for explaining some example embodiments, not for limiting the inventive concepts. When a constituent element is disposed "above" or "on" to another constituent element, the constituent element may include not only an element directly contacting on the upper/lower/left/right sides of the other constituent element, but also an element disposed above/under/left/right the other constituent element in a non-contact manner.

It will be understood that when an element such as a layer, film, region, or substrate is referred to as being "on" another element, it may be directly on the other element or intervening elements may also be present (e.g., the element may be isolated from direct contact with the other element). In contrast, when an element is referred to as being "directly on" another element, there are no intervening elements present. It will be understood that when an element such as a layer, film, region, or substrate is referred to as being "on" another element, it may be above or under the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

As used herein, the singular forms "a," "an" and "the" are intended to include the plural forms as well, unless the context clearly indicates otherwise. Terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Terms such as "first" and "second" are used herein merely to describe a variety of constituent elements, but the constituent elements are not limited by the terms. Such terms are used only for the purpose of distinguishing one constituent element from another constituent element. Furthermore, Terms such as " . . . unit," "~ module," etc. stated in the specification may signify a unit to process at least one function or operation and the unit may be embodied by hardware, software, or a combination of hardware and software.

Hereinafter, some example embodiments are described in detail with reference to the accompanying drawings. In the drawings, like reference numerals denote like constituent elements, and the size, for example, width, thickness, and the like of a layer, a region, and the like, of each constituent element may be exaggerated to a degree for clarity of the specification and for convenience of description. As some example embodiments described below are examples, other modifications may be produced from some example embodiments.

A semiconductor apparatus may have a three-dimensional structure in which two separated electrode lines has an intersection, and may include a semiconductor device having memory properties at the intersection.

FIG. 1 is an equivalent circuit diagram of a semiconductor apparatus 100 including a plurality of semiconductor devices according to some example embodiments. Referring to FIG. 1, the semiconductor apparatus 100 may include a plurality of first electrode lines WL1 and WL2 extending in parallel in a first direction (X direction). Furthermore, the semiconductor apparatus 100 may include a plurality of second electrode lines BL1, BL2, BL3, and BL4 which are spaced apart from the first electrode lines WL1 and WL2 in a third direction (Z direction) and extend in parallel in a second direction. A semiconductor device MC may be disposed between the first electrode lines WL1 and WL2 and the second electrode lines BL1, BL2, BL3, and BL4. In detail, the semiconductor devices MC may be electrically connected to the first electrode lines WL1 and WL2 and the second electrode lines BL1, BL2, BL3, and BL4, and may be disposed at intersections of these lines.

Furthermore, the semiconductor device MC may include a memory element ME and a selection element SW, which are electrically connected to each other. For example, the memory element ME and the selection element SW may be arranged to be serially connected to each other in the third direction (Z direction), and the selection element SW may be electrically connected to one of the first electrode lines WL1 and WL2 and the second electrode lines BL1, BL2, BL3, and BL4 and the memory element ME may be electrically connected to the other of the electrode lines.

In a method of driving the semiconductor apparatus 100, a voltage is applied to the memory element ME of the semiconductor device MC through the first electrode lines WL1 and WL2 and the second electrode lines BL1, BL2, BL3, and BL4, and thus a current may flow in the memory element ME. In detail, the semiconductor device MC may be arbitrarily addressed by selecting the first electrode lines WL1 and WL2 and the second electrode lines BL1, BL2, BL3, and BL4, and the semiconductor device MC may be programmed by applying a certain signal between the first electrode lines WL1 and WL2 and the second electrode lines BL1, BL2, BL3, and BL4. Furthermore, by measuring a current value through the second electrode lines BL1, BL2, BL3, and BL4, information according to a resistance value of the semiconductor device MC, that is, programmed information, may be read out.

The memory element ME may be a non-transitory computer readable storage device that is configured to store information. For example, the memory element ME may include ferroelectrics. The ferroelectrics are materials having ferroelectricity, in which internal dipole moments are aligned without an application of an external electric field and thus spontaneous polarization is maintained. In other words, the ferroelectrics are materials in which, even when a certain voltage is applied thereto and then changed to 0 V, polarization (or an electric field) remains semi-permanently. The semiconductor device MC may be programmed through the above properties of the ferroelectrics, that is, polarization exhibits hysteresis according to an applied voltage.

Furthermore, the selection element SW may perform selection (addressing) of the semiconductor device MC by (e.g., based on) controlling the flow of a current (e.g., electric current) with respect to the memory element ME (e.g., through the memory element ME) that is electrically connected to the selection element SW.

When the selection element SW and the memory element ME are configured as separate devices, increasing a degree of integration of a semiconductor apparatus may be limited thereby. It is because, unlike some example embodiments, in a comparative example, a PN diode or other switch devices may be used as the selection element SW and in the comparative example case, a separate terminal (e.g., electrode, wire, etc.) to electrically connect the device to a memory element is necessary.

According to some example embodiments, the semiconductor device MC may include a ferroelectric layer and a semiconductor layer between two electrodes, and thus the semiconductor apparatus 100 with an increased degree of integration may be provided. In detail, the semiconductor device MC may use the ferroelectric layer as a memory element, and may control the flow of a current with respect to the ferroelectric layer though the semiconductor layer. In such a semiconductor device MC, no separate terminal (e.g., electrode, wire, etc.) is necessary between the ferroelectric layer and the semiconductor layer so that the degree of integration of the semiconductor apparatus 100 may be increased, thereby enabling improved compactness, space efficiency, and/or operational efficiency of the semiconductor apparatus 100. For example, in a semiconductor device according to any of the example embodiments that includes a ferroelectric layer and a semiconductor layer, the ferroelectric layer and the semiconductor layer may be between two electrodes and there may not be any electrode between the ferroelectric layer and the semiconductor layer. Restated, the semiconductor device MC may have no terminals (e.g., no electrodes, conductive paths, wires, etc.) between the ferroelectric layer and the semiconductor layer of the semiconductor device.

Figure 2:
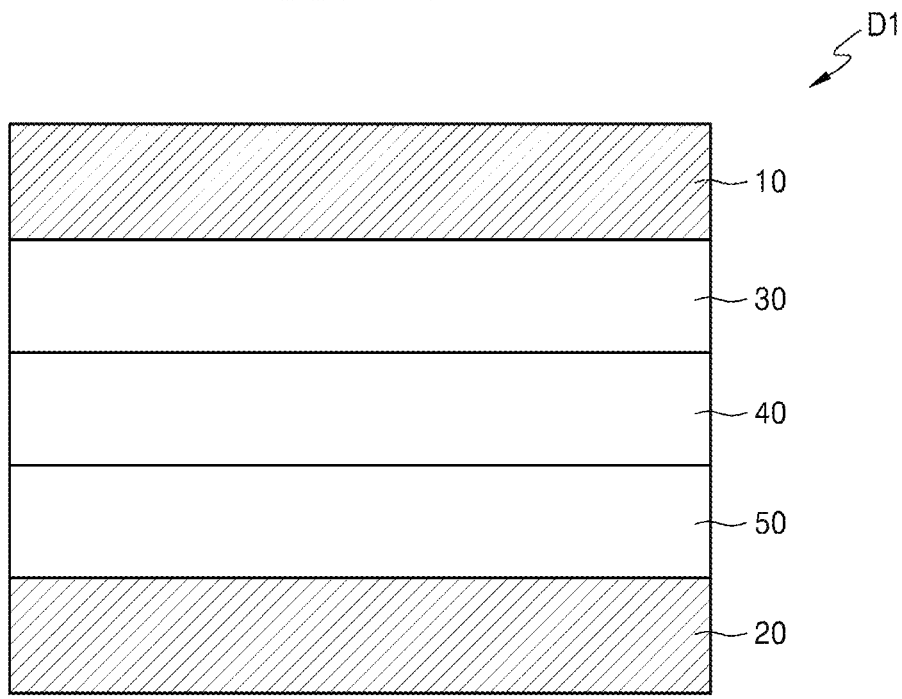
FIG. 2 is a schematic view of a semiconductor device according to some example embodiments.

FIG. 2 is a schematic view of a semiconductor device D1 according to some example embodiments. FIG. 3A, 3B, 3C, 4A, 4B, and FIG. 4C are schematic views of polarization states and energy states of a ferroelectric layer 30 and a semiconductor layer 50 in the semiconductor device D1. The semiconductor device D1 may be included in of the semiconductor devices MC according to any of the example embodiments. In some example embodiments, the semiconductor device D1 may be the memory element ME and/or the switching element SW of a semiconductor device MC shown in FIG. 1.

Referring to FIG. 2, the semiconductor device D1 may include the ferroelectric layer 30 and the semiconductor layer 50 between two electrodes 10 and 20, also referred to herein as a first electrode 10 and a second electrode 20. Restated, the semiconductor device D1 may include a first electrode 10, a second electrode 20 that is isolated from direct contact with the first electrode 10, a ferroelectric layer 30, a conductive metal oxide layer 40, and a semiconductor layer 50. As shown in FIG. 2, the ferroelectric layer 30, the conductive metal oxide layer 40, and the semiconductor layer 50 may be between the first and second electrodes 10 and 20. As shown, the conductive metal oxide layer 40 may be between (e.g., directly or indirectly between) the ferroelectric layer 30 and the semiconductor layer 50, although example embodiments are not limited thereto. As shown, the ferroelectric layer 30 may be between (e.g., directly or indirectly between) the first electrode 10 and the conductive metal oxide layer 40, although example embodiments are not limited thereto. As shown, the semiconductor layer 50 may be between (e.g., directly or indirectly between) the conductive metal oxide layer 40 and the second electrode 20, although example embodiments are not limited thereto. As shown, there may not be any terminals between the ferroelectric layer 30 and the semiconductor layer 50 in the semiconductor device D1.

Figure 3A:
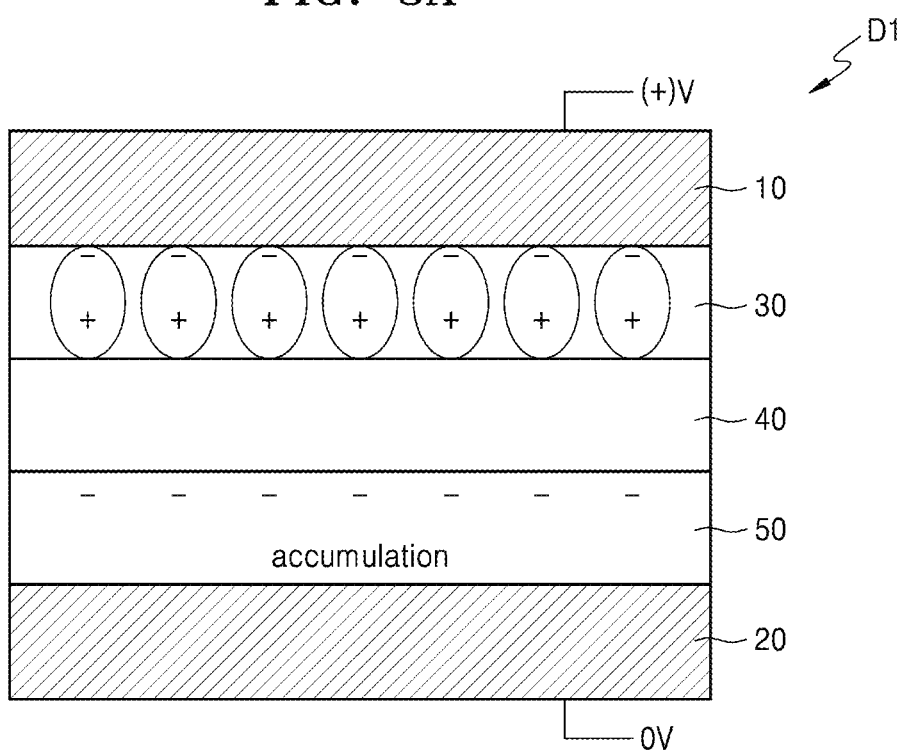
FIG. 3A, 3B, 3C, 4A, 4B, and FIG. 4C are schematic views of polarization states and energy states of a ferroelectric layer and a semiconductor layer in a semiconductor device, according to some example embodiments.
Figure 3B:
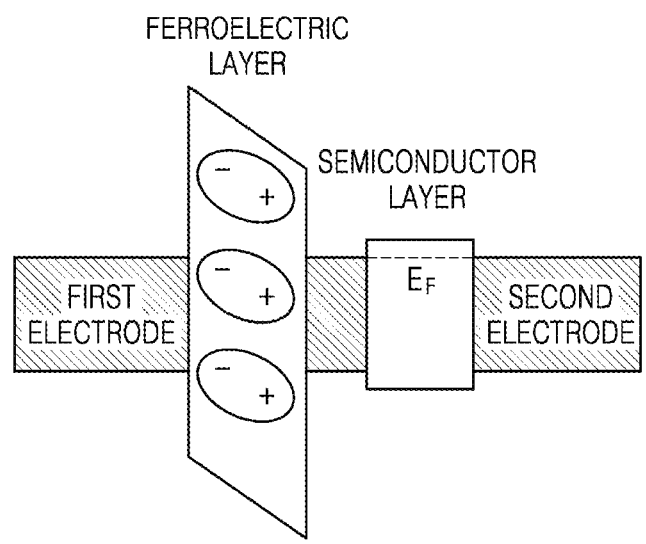

Referring to FIG. 3A, when a positive voltage having a magnitude over (e.g., greater than) the absolute value of a coercive field Ec of the ferroelectric layer 30 is applied between the two electrodes 10 and 20, an electric field between the two electrodes 10 and 20 in the ferroelectric layer 30 may be formed, where the direction of the electric field is from the first electrode 10 to the second electrode 20, and a polarization in a first direction (e.g., first polarization direction) corresponding to a direction of an electric field between the two electrodes 10 and 20 in the ferroelectric layer 30 may be formed (e.g., the ferroelectric layer 30 may be polarized to have polarization in the first direction), and even when the applied electric field is removed, the ferroelectric layer 30 may maintain residual polarization in the first polarization direction. In this state, the ferroelectric layer 30 may be defined as a state in which data "0" is written, or an "on" state in which information is written.

Figure 4A:
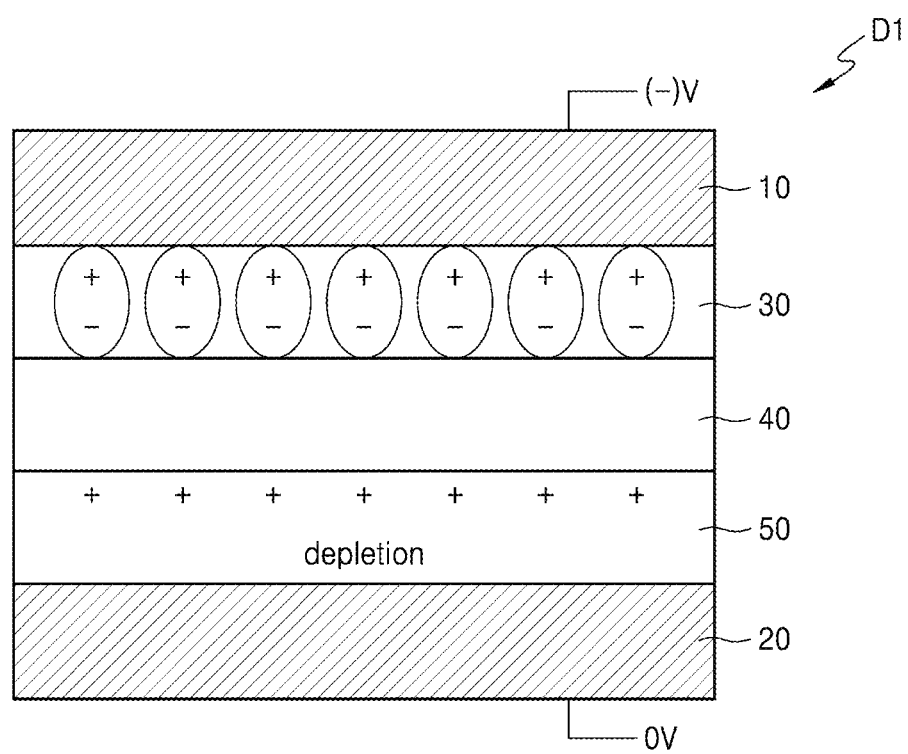
Figure 4B:
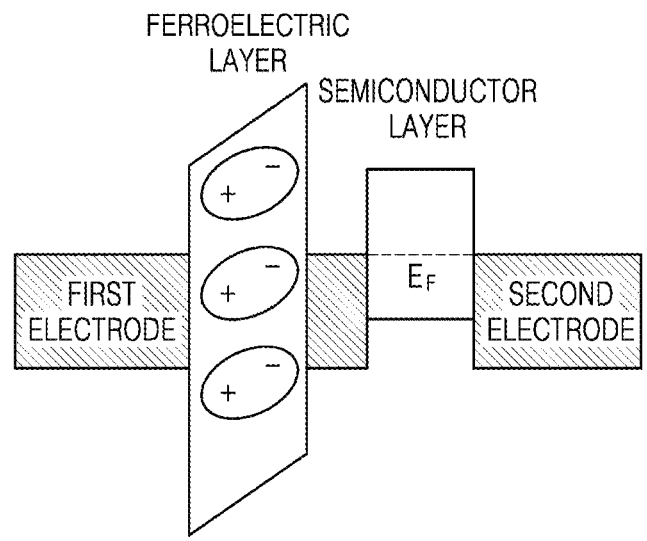

Likewise, referring to FIG. 4A, when a negative voltage having a magnitude over the absolute value of the coercive field Ec of the ferroelectric layer 30 is applied between the two electrodes 10 and 20, an electric field between the two electrodes 10 and 20 in the ferroelectric layer 30 may be formed, where the direction of the electric field is from the second electrode 20 to the first electrode 10, and a polarization in a second direction (e.g., second polarization direction) corresponding to the direction of the electric field between the two electrodes 10 and 20 in the ferroelectric layer 30 may be formed (e.g., the ferroelectric layer 30 may be polarized to have polarization in the second polarization direction), and even when the applied electric field is removed, the ferroelectric layer 30 may maintain residual polarization in the second polarization direction. In this state, the ferroelectric layer 30 may be as a state in which data "1" is written, or an "off" state in which information is erased.

Accordingly, in view of FIGS. 3A-4C, it will be understood that the semiconductor device D1 may be configured to control a polarization direction of polarization of the ferroelectric layer 30 according to a direction of an electric field formed between the first electrode and the second electrode (e.g., based on applying a positive or negative voltage between the two electrodes 10 and 20, where the positive or negative voltage having a magnitude over (e.g., greater than) the absolute value of the coercive field Ec of the ferroelectric layer 30.

Referring to FIGS. 3A and 4A, according to the above polarization state of the ferroelectric layer 30, a depletion region in which electrons that are multiple carriers are not present or an accumulation region in which electrons that are multiple carriers are accumulated, are formed in an area in which the semiconductor layer 50 is contact (e.g., is electrically coupled, for example via the conductive metal oxide layer 40) with the ferroelectric layer 30. The aforementioned area of the semiconductor layer 50 may be a portion of the semiconductor layer 50 that is proximate to the ferroelectric layer 30, for example a portion that includes the surface of the semiconductor layer 50 that is proximate to and/or contacts the conductive metal oxide layer 40. Accordingly, it will be understood that the semiconductor device D1 (e.g., the semiconductor layer 50) may be configured to form a depletion region or an accumulation region in the semiconductor layer 50 according to the polarization direction of the polarization of the ferroelectric layer 30. In some example embodiments, the semiconductor device D1 may not include any conductive metal oxide layer 40. For example, in some example embodiments, the semiconductor device D1 may include the ferroelectric layer 30 and the semiconductor layer 50 directly contacting each other.

The semiconductor layer 50 may control the flow of a current (e.g., electric current through the semiconductor device D1) with respect to the ferroelectric layer 30 through the depletion/accumulation regions. In detail, referring to FIG. 3B, in the state in which data "0" is written to the ferroelectric layer 30 (FIG. 3A), an energy band of the semiconductor layer 50 may be increased. Unlike the above, referring to FIG. 4B, in the state in which data "1" is written to the ferroelectric layer 30 (FIG. 4A), the energy band of the semiconductor layer 50 may be decreased.

Figure 3C:
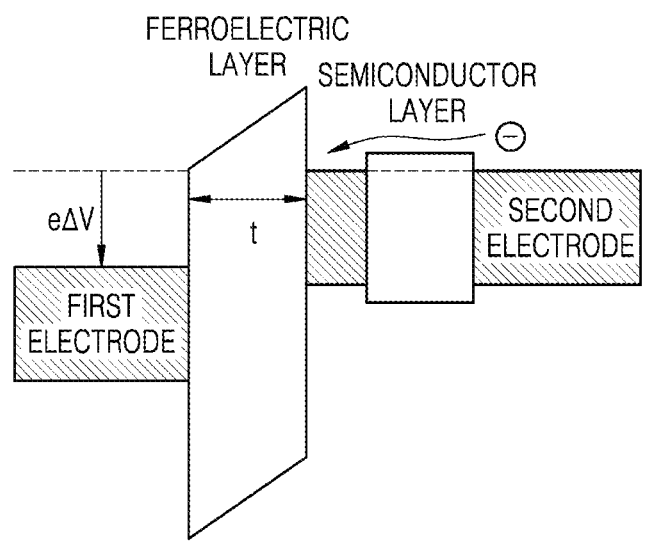
Figure 4C:
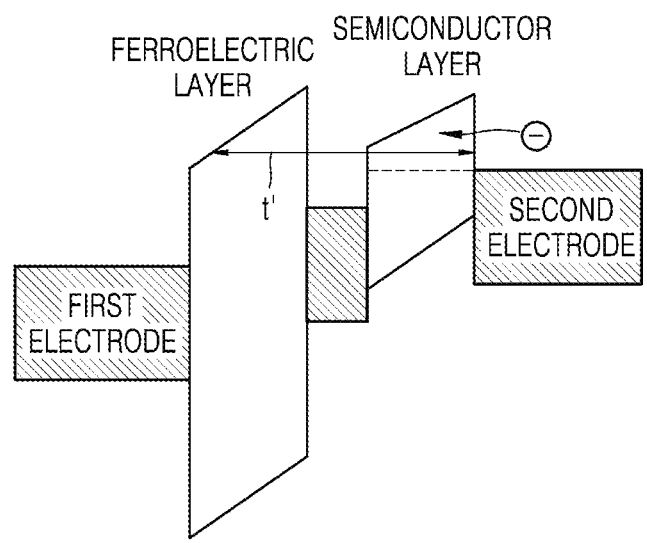

Accordingly, when the data of the ferroelectric layer 30 is read out by applying a voltage having a magnitude less than the absolute value of the coercive field Ec of the ferroelectric layer 30, in the state in which data "0" is written to the ferroelectric layer 30 (FIG. 3A), a potential barrier t between the ferroelectric layer 30 and the semiconductor layer 50 is relatively low so that a current (e.g., electric current) may easily flow between the ferroelectric layer 30 and the semiconductor layer 50 (FIG. 3C). Furthermore, in the state in which data "1" is written to the ferroelectric layer 30 (FIG. 4A), as a potential barrier t' between the ferroelectric layer 30 and the semiconductor layer 50 is relatively high, the flow of a current (e.g., electric current) between the ferroelectric layer 30 and the semiconductor layer 50 may be prevented/restricted (FIG. 4C). Through the above operation, the semiconductor device D1 may read out stored data.

The ferroelectric layer 30 may include a material fluorite-based material such as a hafnium-based oxide. The hafnium-based oxide has ferroelectricity even in a very thin film of a level of several nanometers (e.g., about 0.1 nm to about 5 nm), and is friendly to a semiconductor process, thereby contributing to the integration and miniaturization of a semiconductor device.

The fluorite-based material such as a hafnium-based oxide may have ferroelectricity in an orthorhombic crystal phase, a crystal direction of the crystal phase may have a great effect on the ferroelectricity of ferroelectrics. For example, a fluorite-based material having a (001) or (111) crystal direction may have a high polarization efficiency $P_{eff}$, compared to a case having a random crystal direction. As described herein, a material that has one or more crystal directions (e.g., (001), (111), etc.) will be understood to have a crystal structure that has the one or more crystal directions.

Accordingly, the semiconductor device D1 according to some example embodiments may further include a conductive metal oxide layer 40 that does not prevent the flow of a current (e.g., electric current) in the device while controlling the crystal direction of the ferroelectric layer 30 (e.g., the conductive metal oxide layer 40 is configured to not the flow of a current (e.g., electric current) in the device while controlling the crystal direction of the ferroelectric layer 30).

The conductive metal oxide layer 40 may be arranged adjacent to the ferroelectric layer 30. For example, the conductive metal oxide layer 40 may be arranged between (e.g., directly or indirectly between) the ferroelectric layer 30 and the semiconductor layer 50.

The conductive metal oxide layer 40 may have a crystal direction that is the same as or similar to a desired crystal direction of the ferroelectric layer 30. For example, the conductive metal oxide layer 40 may have a crystal structure having a (111) and/or (001) crystal direction. In detail, the conductive metal oxide layer 40 may include crystals (e.g., a crystal structure) having the (111) and/or (001) crystal direction aligned in the normal direction of a substrate, for example, first and second electrodes 10 and 20 or the semiconductor layer 50 at a dominant ratio among all crystals, that is, the largest ratio or high ratio among all crystal phases. For example, the conductive metal oxide layer 40 may include crystals having the (111) and/or (001) crystal direction aligned in the normal direction of the substrate at a ratio (e.g., proportion) with respect to all crystals within the conductive metal oxide layer 40, for example, 20% or more, 25% or more, 30% or more, 40% or more, 45% or more, 90% or less, 85% or less, 80% or less, 75% or less, 70% or less, 65% or less, 60% or less, or 55% or less.

The conductive metal oxide layer 40 may have a smaller difference in lattice constant from the ferroelectric layer 30. For example, a difference in lattice constant between the conductive metal oxide layer 40 and the ferroelectric layer 30 may be 10% or less, 8% or less, 6% or less, 5% or less, or 3% or less. For example, a difference in lattice constant between the conductive metal oxide layer 40 and the ferroelectric layer 30 may be 0% or more, 0.01% or more, 0.5% or more, 1% or more, 2% or more, or 2.5% or more.

The conductive metal oxide layer 40 may include one or two more materials selected from the group consisting of an indium oxide ($In_2O_3$), a zinc oxide (ZnO), a tin oxide ($SnO_2$), and any combination thereof. The oxide may have a structure similar to a ferroelectric layer, for example, a hafnium-based oxide, so as to have a small interface resistance. For example, the conductive metal oxide layer 40 may include one or more materials selected from the group consisting of an indium gallium zinc oxide (IGZO), an indium tin oxide (ITO), an indium zinc oxide (IZO), ZnO, $SnO_2$, $In_2O_3$, and a combination thereof.

The conductive metal oxide layer 40 may have an electrical conductivity of about 100 S/cm or more (e.g., equal to or greater than about 100 S/cm). For example, the electrical conductivity of the conductive metal oxide layer 40 may be about 500 S/cm or more, about 1000 S/cm or more, about 1500 S/cm or more, about 2000 S/cm or more, about 2500 S/cm or more, about 3000 S/cm or more, about 3500 S/cm or more, about 4000 S/cm or more, about 4500 S/cm or more, or about 5000 S/cm or more.

The conductive metal oxide layer 40 may have an electrical conductivity of about 100000 S/cm or less (e.g., equal to or less than about 100000 S/cm). For example, the electrical conductivity of the conductive metal oxide layer 40 may be about 50000 S/cm or less, about 10000 S/cm or less, or about 5000 S/cm or less.

The ferroelectric layer 30 may include a material that is expressed to be $MO_2$ where M is Hf, Zr, or a combination thereof. Furthermore, the ferroelectric layer 30 may include a material represented by $MO_2$, where M is Hf, Zr, or a combination thereof, as a base material (e.g., an underlying material on which other materials of the ferroelectric layer 30 are applied to form the ferroelectric layer 30), and may further include one or two more dopant materials selected from the group consisting of C, Si, Ge, Sn, Pb, Al, Y, La, Gd, Mg, Ca, Sr, Ba, Ti, Zr, Hf, and any combination thereof.

Furthermore, the ferroelectric layer 30 may include an orthorhombic crystal phase (e.g., a orthorhombic crystal system). For example, the ferroelectric layer 30 may include various crystal phases (e.g., crystal systems) such as an orthorhombic crystal phase, a tetragonal crystal phase, and the like, and may have the orthorhombic crystal phase dominantly, that is, at the largest ratio or high ratio among all crystal phases (e.g., the majority crystal phase in the ferroelectric layer 30). A crystal phase distribution may be checked by using methods that are well known in the art, for example, transmission electron microscopy (TEM), grazing Incidence X-ray diffraction (GIXRD), and the like.

The ferroelectric layer 30 may have a (111) and/or (001) crystal direction. In detail, the ferroelectric layer 30 may include crystals having the (111) and/or (001) crystal direction aligned in the normal direction of the substrate, for example, the first and second electrodes 10 and 20, the conductive metal oxide layer 40, or the semiconductor layer 50, at a dominant ratio of all crystals, that is, the largest ratio or high ratio among all crystal phases. For example, the crystals having the (111) and/or (001) crystal direction aligned in the normal direction of the substrate may be 20% or more, 25% or more, 30% or more, 40% or more, 45% or more, 90% or less, 85% or less, 80% or less, 75% or less, 70% or less, 65% or less, 60% or less, or 55% or less of all crystals in the ferroelectric layer 30.

The semiconductor layer 50 may include Group III-V compound semiconductors, organic semiconductors, metal oxide semiconductors, two-dimensional materials, transition metal dichalcogenides, and/or quantum dots. The semiconductor layer may include one or more materials selected from the group consisting of Group III-V compound semiconductors, organic semiconductors, metal oxide semiconductors, two-dimensional materials, transition metal dichalcogenides, and quantum dots. The semiconductor layer 50 may include $In_2O_3$, ZnO, $SnO_2$ a vanadium oxide ($VO_2$), a titanium oxide ($TiO_2$), a copper oxide ($Cu_2O$), and/or a tungsten oxide ($WO_3$), and the metal oxide may further include a dopant material. For example, the semiconductor layer 50 may include IGZO.

The semiconductor layer 50 may have an energy bandgap of about 5.0 eV or less. For example, the semiconductor layer 50 may have an energy bandgap of about 0.1 eV or more, about 0.5 eV or more, about 0.8 eV or more, about 1.0 eV or more, about 5.0 eV or less, about 4.5 eV or less, about 4.0 eV or less, about 3.8 eV or less, or about 3.5 eV or less.

The ferroelectric layer 30, the conductive metal oxide layer 40, and the semiconductor layer 50 may be all metal oxides. Restated, the ferroelectric layer 30, the conductive metal oxide layer 40, and the semiconductor layer 50 may each include or may be a metal oxide, which may be the same metal oxide or different metal oxides. The semiconductor device D1 may include three layers of the same kind between the two electrodes 10 and 20, may have a small interface resistance between the layers, and may be easy in the process (e.g., may have improved operation efficiency due to the small interface resistance).

The ferroelectric layer 30, the conductive metal oxide layer 40, and the semiconductor layer 50 each may independently have a thickness of 20 nm or less and may have same or different thicknesses. For example, the ferroelectric layer 30, the conductive metal oxide layer 40, and the semiconductor layer 50 each may independently have a thickness of over 0 nm (e.g., greater than 0.01 nm), about 0.1 nm or more, about 1 nm or more, about 2 nm or more, about 20 nm or less, about 18 nm or less, about 15 nm or less, or about 10 nm or less. The ferroelectric layer 30, the conductive metal oxide layer 40, and the semiconductor layer 50 may each independently have a thickness between about 0.1 nm and about 20 nm.

The first electrode 10 and/or the second electrode 20 each may independently include a metal, a metal nitride, a metal oxide, or any combination thereof. In detail, the first electrode 10 and/or the second electrode 20 each may independently include metal such as ruthenium (Ru), titanium (Ti), tantalum (Ta), niobium (Nb), iridium (Ir), molybdenum (Mo), tungsten (W), platinum (Pt), and the like, a conductive metal nitride such as a titanium nitride (TiN), a tantalum nitride (TaN), a niobium nitride (NbN), a molybdenum nitride (MoN), a cobalt nitride (CoN), a tungsten nitride (WN), and the like, and/or a conductive metal oxide such as a platinum oxide (PtO), an iridium oxide ($IrO_2$), a ruthenium oxide ($RuO_2$), a strontium ruthenium oxide ($SrRuO_3$), a barium strontium ruthenium oxide (($Ba,Sr)RuO_3$), a calcium ruthenium oxide ($CaRuO_3$), a lanthanum strontium cobalt oxide (($La,Sr)CoO_3$), and the like.

The semiconductor device D1 may be configured to have a variable resistance during driving of the device as described above. For example, as shown in FIGS. 3C and 4C, the semiconductor device D1 may have a high resistance and a low resistance in an operation of reading out the stored data by the semiconductor device D1. The semiconductor device may thus be configured to have a variable resistance (e.g., variable resistance value) that is generated according to a polarization direction of a polarization of the ferroelectric layer. A ratio of the high resistance value and the low resistance value (e.g., resistance ratio) of the semiconductor device D1 (e.g., a resistance ratio of the variable resistance of the semiconductor device D1) may be about 5.0 or more, about 7.0 or more, or about 10.0 or more. The resistance ratio of the semiconductor device D1 (e.g., a resistance ratio of the variable resistance of the semiconductor device D1) may be about 100.0 or less, about 50.0 or less, about 20.0 or less, or about 15.0 or less.

Figure 9:
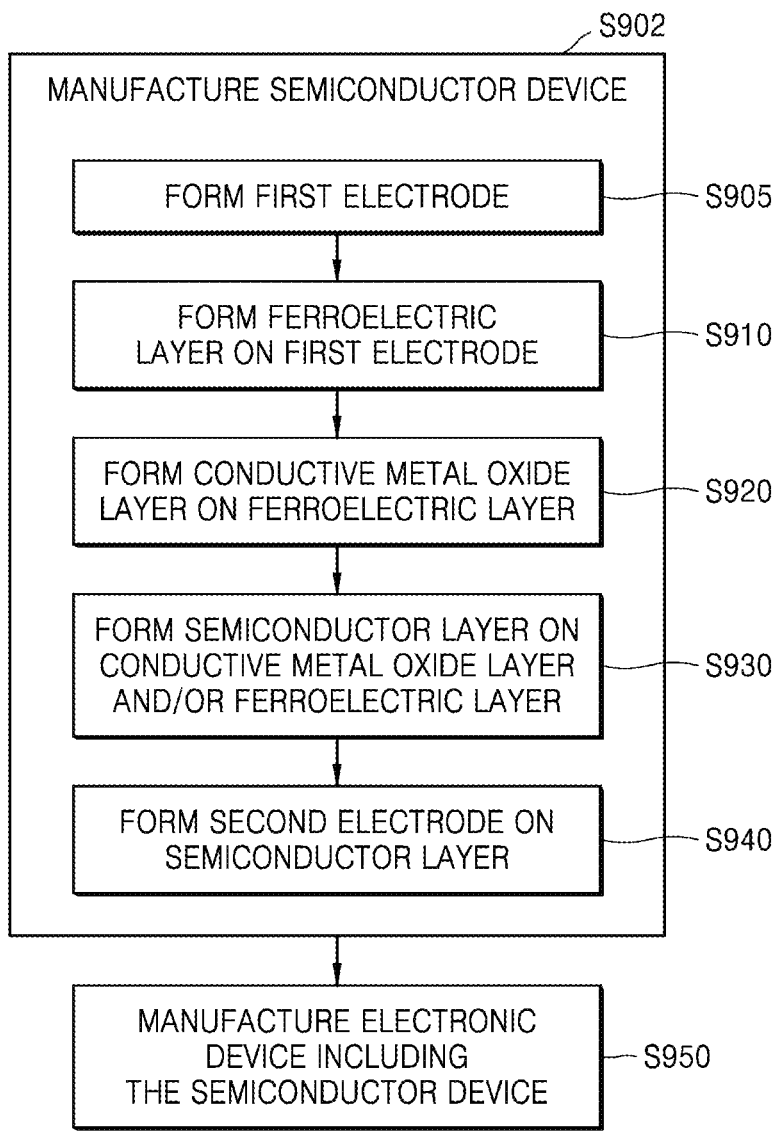
FIG. 9 is a flowchart showing a method according to some example embodiments.

FIG. 9 is a flowchart showing a method according to some example embodiments. The semiconductor device D1 may be manufactured according to typical methods that are well known to the art. For example, referring to FIG. 9, the semiconductor device D1 may be manufactured (S902) based on forming the first electrode 10 (S905) and sequentially forming, on (e.g., directly or indirectly on) the first electrode 10, the ferroelectric layer 30 (S910), the conductive metal oxide layer 40 (e.g., directly or indirectly on the ferroelectric layer 30) (S920), and the semiconductor layer 50 (e.g., directly or indirectly on the ferroelectric layer 30 and/or the conductive metal oxide layer 40) (S930), and further forming the second electrode 20 on (e.g., directly or indirectly on) the semiconductor layer 50 (S940) such that the ferroelectric layer 30, the conductive metal oxide layer 40, and the semiconductor layer 50 are between the first electrode 10 and the second electrode 20. In some example embodiments, for example where the semiconductor device D1 does not include the conductive metal oxide layer 40, operation S920 may be omitted from the method shown in FIG. 9 such that operation S930 includes forming the semiconductor layer 50 on (e.g., directly or indirectly on) the ferroelectric layer 30 and operation S940 includes forming the second electrode 20 on (e.g., directly or indirectly on) the semiconductor layer 50 such that the ferroelectric layer 30 and the semiconductor layer 50 are between the first electrode 10 and the second electrode 20. In example embodiments where operation S920 is performed to form the conductive metal oxide layer 40 on the ferroelectric layer 30, the semiconductor layer 50 is formed on the conductive metal oxide layer at S930, such that, upon performing S902 in total to manufacture the semiconductor device D1 (S905-S940) the conductive metal oxide layer 40 is between the ferroelectric layer 30 and the semiconductor layer 50, and the ferroelectric layer 30, the conductive metal oxide layer 40, and the semiconductor layer 50 are between the first electrode 10 and the second electrode 20 of the manufactured semiconductor device D1.

As further shown in FIG. 9, the method may further include manufacturing an electronic device (e.g., electronic device 1400 shown in FIG. 14) that includes the semiconductor device D1 (S950) according to typical methods that are well known to the art, for example based on incorporating the semiconductor device D1 into one or more of a memory 1430, processor 1420, or the like of the electronic device (e.g., via bonding the semiconductor device D1 to various articles of circuitry to manufacture a processor 1420 and/or memory 1430).

The constituent elements such as the first and second electrodes 10 and 20, the ferroelectric layer 30, the conductive metal oxide layer 40, and the semiconductor layer 50, and the like may be formed by methods that are well known in the art. These constituent elements each may be formed to independently have desired composition and thickness through deposition methods such as an atomic layer deposition (ALD), a chemical vapor deposition (CVD), a physical vapor deposition (PVD), or sputtering, and the like.

When the ferroelectric layer 30, the conductive metal oxide layer 40, and the semiconductor layer 50 all include a metal oxide, the ferroelectric layer 30, the conductive metal oxide layer 40, and the semiconductor layer 50 may be formed in the same process, and thus the semiconductor device D1 may be easily manufactured. In detail, the semiconductor device D1 may be manufactured through operations including forming, on the second electrode 20, a semiconductor layer or semiconducting metal oxide layer 50 including one or two more materials selected from the group consisting of $In_2O_3$, ZnO, $SnO_2$ $VO_2$, $TiO_2$, $Cu_2O$, and $WO_3$, forming, on the semiconductor layer or semiconducting metal oxide layer 50, the conductive metal oxide layer 40 including one or two more materials selected from the group consisting of IGZO, ITO, IZO, ZnO, $SnO_2$, $In_2O_3$ and a combination thereof, forming, on the conductive metal oxide layer 40, a ferroelectric layer or ferroelectric metal oxide layer 30 including $MO_2$, where M is Hf, Zr, or a combination thereof, and forming the first electrode 10 on the ferroelectric layer or ferroelectric metal oxide layer 30.

For example, the ferroelectric layer 30, the conductive metal oxide layer 40, and the semiconductor layer 50 may be formed by an ALD method. The ALD method is advantageous in that a uniform layer may be formed in atomic units and the method may be performed at a relatively low temperature. In detail, the ferroelectric layer 30, the conductive metal oxide layer 40, and the semiconductor layer 50 each may be independently formed by repeating a deposition cycle once or multiple times, the deposition cycle including operations of supplying a metal precursor, purging the metal precursor, supplying a reaction gas, for example, an oxygen supply source, and purging the reaction gas. In detail, the semiconductor device D1 may be manufactured through operations including forming, on the second electrode 20, a semiconductor layer (semiconducting metal oxide layer, indium gallium zinc metal oxide layer) 50 by providing an indium precursor, a gallium precursor, a zinc precursor, and an oxygen supply source, forming, on the semiconductor layer 50, a conductive metal oxide layer (indium tin oxide layer) 40 by providing an indium precursor, a tin precursor, and an oxygen supply source, and forming, on the conductive metal oxide layer 40, a ferroelectric layer (ferroelectric metal oxide layer and hafnium zirconium oxide layer) 30 by providing and crystalizing a hafnium precursor, a zirconium precursor, and an oxygen supply source.

A metal precursor such as an indium precursor, a gallium precursor, a zinc precursor, a tin precursor, a hafnium precursor, a zirconium precursor, and the like may independently include a metal organic compound represented by $AR_x$. A denotes a metal element including one or two more materials selected from the group consisting of indium, gallium, zinc, tin, hafnium, and zirconium, R denotes $C_1$ to $C_{10}$ alkyl groups, $C_2$ to $C_{10}$ alkenyl groups, carbonyl group (C=O), halide, $C_6$ to $C_{10}$ aryl groups, $C_6$ to $C_{10}$ cycloalkyl groups, $C_6$ to $C_{10}$ cycloalkenyl groups, (C=O)R, where R id a hydrogen or $C_1$ to $C_{10}$ alkyl groups, $C_1$ to $C_{10}$ alkoxy groups, $C_1$ to $C_{10}$ amidinates, $C_1$ to $C_{10}$ alkylamides, $C_1$ to $C_{10}$ alkylimides, —N(Q)(Q'), where Q and Q' are independently $C_1$ to $C_{10}$ alkyl groups or a hydrogen), Q(C=O)CN, where Q is a hydrogen or $C_1$ to $C_{10}$ alkyl groups, and $C_1$ to $C_{10}$ β-diketonates, and x may be greater than 0 and 6 or less.

$O_3$, $H_2O$, $O_2$, $N_2O$, $O_2$, and/or plasma may be used as the oxygen supply source.

The metal precursor, the reaction gas, for example, a nitrifying agent, and/or by-products thereof, which are supplied in each process, but not used for reaction, may be removed by purging. An inert gas such as Ar, He, Ne, and the like, and/or a $N_2$ gas may be used in the purging.

During the manufacture of the ferroelectric layer 30, for example, a ferroelectric metal oxide layer, the crystallization operation may be performed through a heat treatment. The heat treatment may be performed after the supply of the metal precursor and the oxygen supply source and/or the formation of the first electrode 10.

The heat treatment may be performed at a temperature and/or for a period in which the metal oxide layer 30 has ferroelectricity. For example, the heat treatment may be performed at a temperature and/or for a period, in which the metal oxide layer 30 has a dominant orthorhombic crystal phase. For example, the heat treatment may be performed at a temperature of about 400° C. to about 1100° C., but the inventive concepts are not limited thereto. The heat treatment may be performed for a period of 1 nano-second or more, 1 micro-second or more, 0.001 seconds or more, 0.01 seconds or more, 0.05 seconds or more, 0.1 seconds or more, 0.5 seconds or more, 1 second or more, 3 seconds or more, 5 seconds or more, 10 minutes or less, 5 minutes or less, 1 minute or less, or 30 seconds or less, but the inventive concepts are not limited thereto.

According to another aspect, a semiconductor apparatus including a plurality of the semiconductor devices D1 described above may be provided.

Figure 5A:
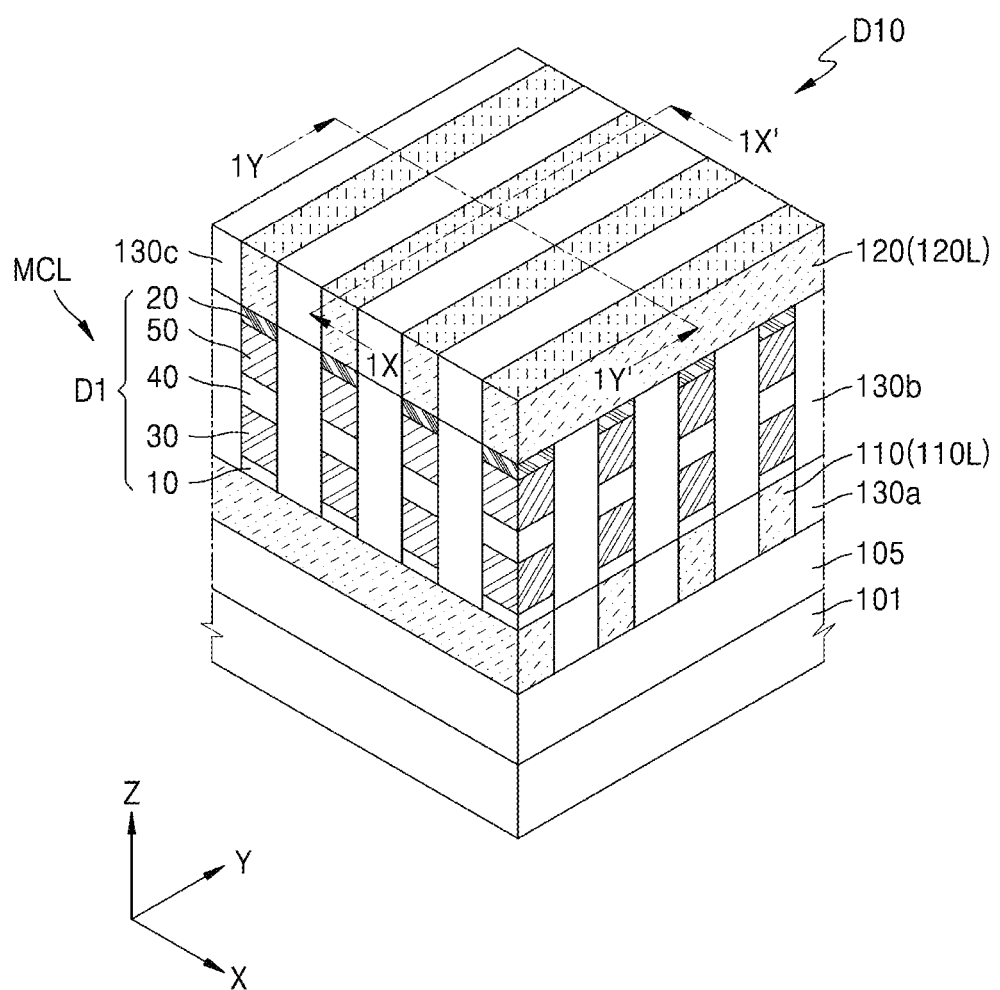
FIG. 5A is a perspective view of a semiconductor apparatus according to some example embodiments.
Figure 5B:
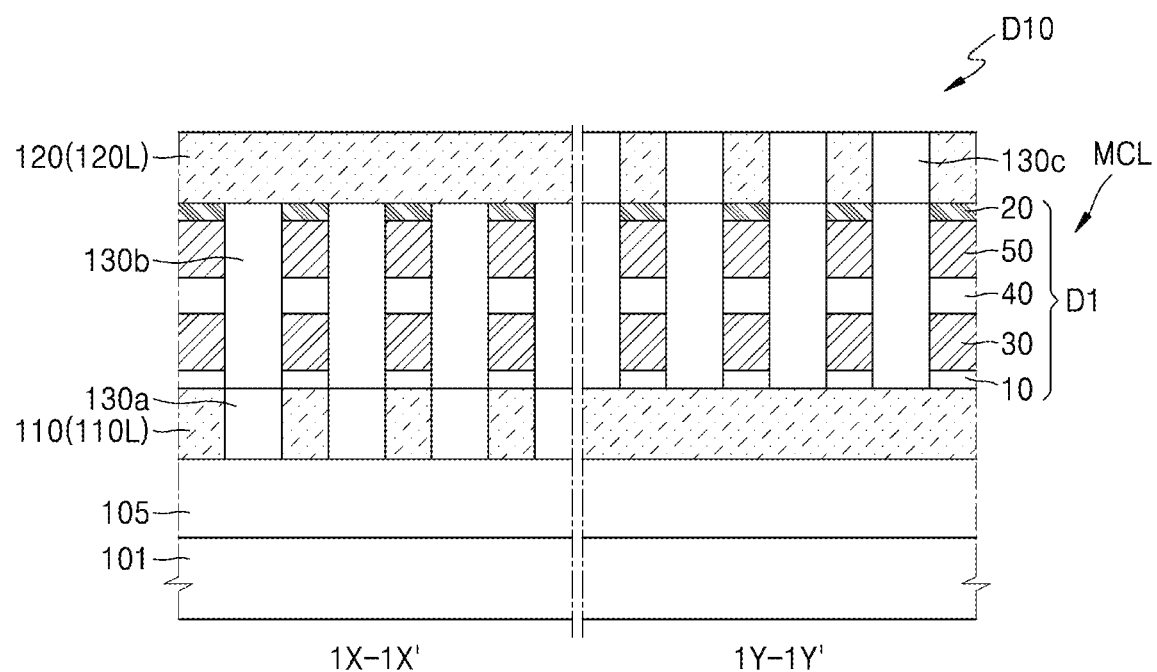
FIG. 5B is a cross-sectional view of the semiconductor apparatus of FIG. 5A taken along lines 1X-1X' and 1Y-1Y'.

FIGS. 5A and 5B are respectively a perspective view and a cross-sectional view of a semiconductor apparatus D10 an according to some example embodiments. FIG. 5A is a perspective view of a semiconductor apparatus according to some example embodiments, and FIG. 5B is a cross-sectional view of the semiconductor apparatus of FIG. 5A taken along lines 1X-1X' and 1Y-1Y'.

Referring to FIGS. 5A and 5B, the semiconductor apparatus D10 may include, on a substrate 101, a first electrode line layer 110L, a second electrode line layer 120L, and a semiconductor device layer MCL.

The first electrode line layer 110L may include a plurality of first electrode lines 110 extending in a first direction (X direction) parallel to each other and in parallel to an upper surface of the substrate 101 as shown in FIGS. 5A-5B. The second electrode line layer 120L may be arranged spaced apart from the first electrode line layer 110L, and may include a plurality of second electrode lines 120 extending in a second direction (Y direction) parallel to each other and in parallel to an upper surface of the substrate 101 as shown in FIGS. 5A-5B. The first direction and the second direction may be different from each other and may each be parallel to an upper surface of the substrate 101 as shown in FIG. 5A-5B, and may intersect perpendicularly to each other like the X direction and the Y direction of FIG. 5A, but the inventive concepts are not limited thereto. In terms of driving of a semiconductor apparatus, the first electrode lines 110 may correspond to one of a word line and a bit line, and the second electrode lines 120 may correspond to the other line.

The first electrode lines 110 and the second electrode lines 120 each may independently include a metal, a conductive metal nitride, a conductive metal oxide, or a combination thereof. For example, the first electrode lines 110 and the second electrode lines 120 each may independently W, WN, Au, Ag, Cu, Al, TiAlN, Ir, Pt, Pd, Ru, Zr, Rh, Ni, Co, Cr, Sn, Zn, ITO, an alloy thereof, or a combination thereof. Furthermore, the first electrode lines 110 and the second electrode lines 120 each may independently a metal film and a conductive barrier layer covering part or all of the metal film. The conductive barrier layer may include, for example, Ti, TiN, Ta, TaN, or a combination thereof.

The semiconductor device layer MCL may include a plurality of the semiconductor devices D1. Each of the semiconductor devices D1 may be any of the semiconductor devices according to any of the example embodiments, including the semiconductor device D1 shown in FIGS. 2-4C. The semiconductor devices D1 may be arranged spaced apart from each other (e.g., isolated from direct contact with each other), and may have a three-dimensional structure between the first electrode lines 110 and the second electrode lines 120 at intersections of the first electrode lines 110 and the second electrode lines 120. For example, as shown in at least FIGS. 5A-5B, each of the semiconductor devices D1 may be between the first electrode lines 110 and the second electrode lines 120 at an intersection of one of the first electrode lines 110 and one of the second electrode lines 120 where the one of the first electrode lines 110 and the one of the second electrode lines 120 overlap each other in a vertical direction (e.g., Z direction) that is perpendicular to the first direction (e.g., X direction) and is perpendicular to the second direction (e.g., Y direction).

The first electrode lines 110 and the second electrode lines 120 each may be electrically connected to the first electrode 10 and the second electrode 20 of the semiconductor device D1 or integrally formed with the first electrode 10 and the second electrode 20, respectively. Alternatively, the first electrode 10 and the second electrode 20 may be omitted.

An insulating layer may be further provided between the first electrode lines 110, between the second electrode lines 120, and/or between the semiconductor devices D1. In detail, a first insulating layer 130a may be provided between the first electrode lines 110, a second insulating layer 130b may be provided between the semiconductor devices D1 that are spaced apart from each other in the semiconductor device layer MCL, and a third insulating layer 130c may be provided between the second electrode lines 120. The first insulating layer 130a, the second insulating layer 130b, and/or the third insulating layer 130c each may include a dielectric material including an oxide and/or a nitride, and may include the same material or materials different from each other. Furthermore, the first insulating layer 130a, the second insulating layer 130b, and/or the third insulating layer 130c each may be an air gap. In this case, an insulating liner (not shown) may be formed between the air gap and each of the first electrode lines 110, the second electrode lines 120, or the semiconductor device D1.

The substrate 101 may include, for example, semiconductor materials such as silicon (Si), germanium (Ge), silicon germanium (SiGe), silicon carbide (SiC), gallium arsenic (GaAs), indium arsenic (InAs), indium phosphide (InP), and the like, and an insulating material such as a silicon oxide, a silicon nitride, a silicon oxynitride, or the like.

The semiconductor apparatus D10 may further include an interlayer insulating layer 105 on the substrate 101. The interlayer insulating layer 105 may be arranged between the substrate 101 and the first electrode line layer 110L to electrically insulate the substrate 101 and the first electrode line layer 110L from each other. The interlayer insulating layer 105 may include an oxide such as a silicon oxide and/or a nitride such as a silicon nitride.

The semiconductor apparatus may include two or more semiconductor device layers MCL.

Figure 6:
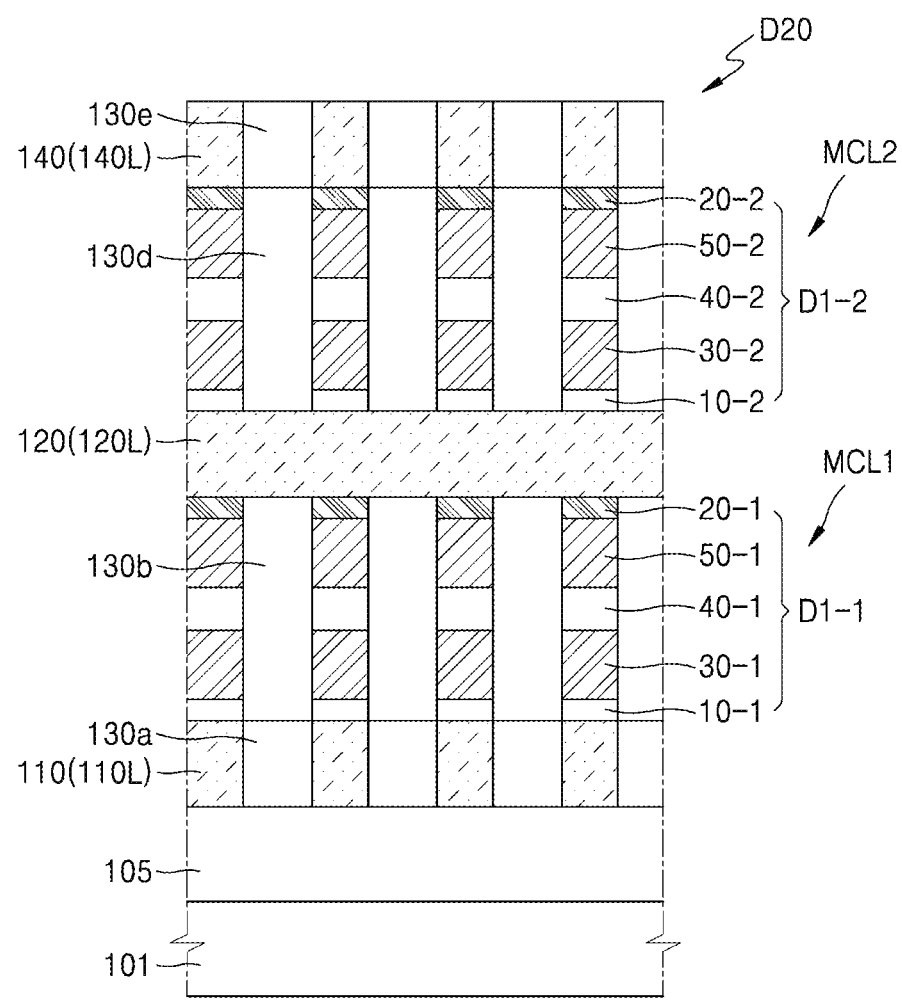
FIG. 6 is a cross-sectional view of a semiconductor apparatus according to some example embodiments.

FIG. 6 is a cross-sectional view of a semiconductor apparatus according to some example embodiments.

Referring to FIG. 6, a semiconductor apparatus D20 may include, on the substrate 101, the first electrode line layer 110L, the second electrode line layer 120L, a third electrode line layer 140L, a first semiconductor device layer MCL1, and a second semiconductor device layer MCL2. The first semiconductor device layer MCL1 may include a plurality of first semiconductor devices D1-1, and the second semiconductor device layer MCL2 may include a plurality of the second semiconductor devices D1-2. The first semiconductor devices D1-1 may include a first electrode 10-1, a ferroelectric layer 30-1, a conductive metal oxide layer 40-1, a semiconductor layer 50-1 and a second electrode 20-1. The second semiconductor devices D1-2 may include a first electrode 10-2, a ferroelectric layer 30-2, a conductive metal oxide layer 40-2, a semiconductor layer 50-2, and a second electrode 20-2. The materials of the above constituent elements may be substantially the same as those of the first electrode 10, the ferroelectric layer 30, the conductive metal oxide layer 40, the semiconductor layer 50, and the second electrode 20, which are described above. The first semiconductor device layer MCL1 may be provided between the first electrode line layer 110L and the second electrode line layer 120L, and the second semiconductor device layer MCL2 may be provided between the second electrode line layer 120L and the third electrode line layer 140L. In detail, the first electrode line layer 110L and the third electrode line layer 140L may extend in the same direction, that is, the first direction (X direction), and may be arranged spaced apart from each other in the third direction (Z direction). Furthermore, the second electrode line layer 120L may extend in the second direction (Y direction), and may be arranged spaced apart from each other in the third direction (Z direction) between the first electrode line layer 110L and the third electrode line layer 140L. The first semiconductor device layer MCL1 may be arranged between the first electrode line layer 110L and the second electrode line layer 120L at an intersection of the first electrode line layer 110L and the second electrode line layer 120L. The second semiconductor device layer MCL2 may be arranged between the second electrode line layer 120L and the third electrode line layer 140L at an intersection of the second electrode line layer 120L and the third electrode line layer 140L.

In some example embodiments, the semiconductor apparatus D20 may be understood to include the third electrode lines 140 on the first electrode lines 110 and the second electrode lines 120, the third electrode lines extending in the same first direction in which the first electrode lines 110 extend (e.g., the X direction), at least one first semiconductor device D1-1 between the first electrode lines 110 and the second electrode lines 120 at an intersection of the first electrode lines 110 and the second electrode lines 120 where one of the first electrode lines 110 and one of the second electrode lines 120 overlap each other in a vertical direction (e.g., Z direction) that is perpendicular to the first direction (e.g., X direction) and is perpendicular to the second direction (e.g., Y direction) and at least one second semiconductor device D1-2 between the second electrode lines 120 and the third electrode lines 140 at an intersection of the one of the second electrode lines 120 and one of the third electrode lines 140 where one of the second electrode lines 120 and the one of the third electrode lines 140 overlap each other in in the vertical direction, the second semiconductor device having a same structure as the first semiconductor device. Each of the first and second semiconductor devices may have a same or different structure as each other, which may be a same structure as the structure of any of the semiconductor devices according to any of the example embodiments.

An insulating layer may be further provided between the first electrode lines 110, between the second electrode lines 120, between the third electrode lines 140, and/or between the semiconductor devices D1-1 and/or D1-2. In detail, a first insulating layer 130a may be provided between the first electrode lines 110, a second insulating layer 130b may be provided between the semiconductor devices D1-1 that are spaced apart from each other in the first semiconductor device layer MCL1, a third insulating layer 130c may be provided between the second electrode lines 120, a fourth insulating layer 130d may be provided between the semiconductor devices D1-2 that are spaced apart from each other in the second semiconductor device layer MCL2, and a fifth insulating layer 130e may be provided between the third electrode lines 140. The first insulating layer 130a, the second insulating layer 130b, the third insulating layer 130c, the fourth insulating layer 130d, and/or the fifth insulating layer 130e each may include a dielectric material including an oxide and/or a nitride, and may include the same material or materials different from each other. Furthermore, the first insulating layer 130a, the second insulating layer 130b, the third insulating layer 130c, the fourth insulating layer 130d, and/or the fifth insulating layer 130e each may be an air gap. In this case, an insulating liner (not shown) may be formed between the air gap and each of the first electrode lines 110, the second electrode lines 120, the third electrode lines 140, the first semiconductor devices D1-1, or the second semiconductor devices D1-2.

In terms of driving of the semiconductor apparatus D20, the first electrode line layer 110L and the third electrode line layer 140L may be word lines or bit lines, and the second electrode line layer 120L may be a common bit line or a common word line.

Although FIG. 6 illustrates the semiconductor apparatus D20 having two semiconductor device layers (MCL1 and MCL2), the number of semiconductor device layers and the number of electrode line layers may be appropriately adjusted according to a desired performance level.

The semiconductor apparatus D20 may further include a driving circuit area (not shown) on the substrate 101. The driving circuit area may include a circuit portion, such as a peripheral circuit, a driving circuit, a core circuit, and the like, for driving the first and second semiconductor devices D1-1 and D1-2 or performing arithmetic processing. The above circuits may include, for example, a page buffer, a latch circuit, a cache circuit, a column decoder, a sense amplifier, a data in/out circuit, a row decoder, or the like.

Furthermore, the circuits may be arranged between the substrate 101 and the semiconductor device layer MCL. In other words, the driving circuit area and the first and second semiconductor device layer MCL1 and MCL2 may be sequentially arranged on the substrate 101, and the arrangement structure may be a cell on peripheral (COP) structure.

Figure 7:
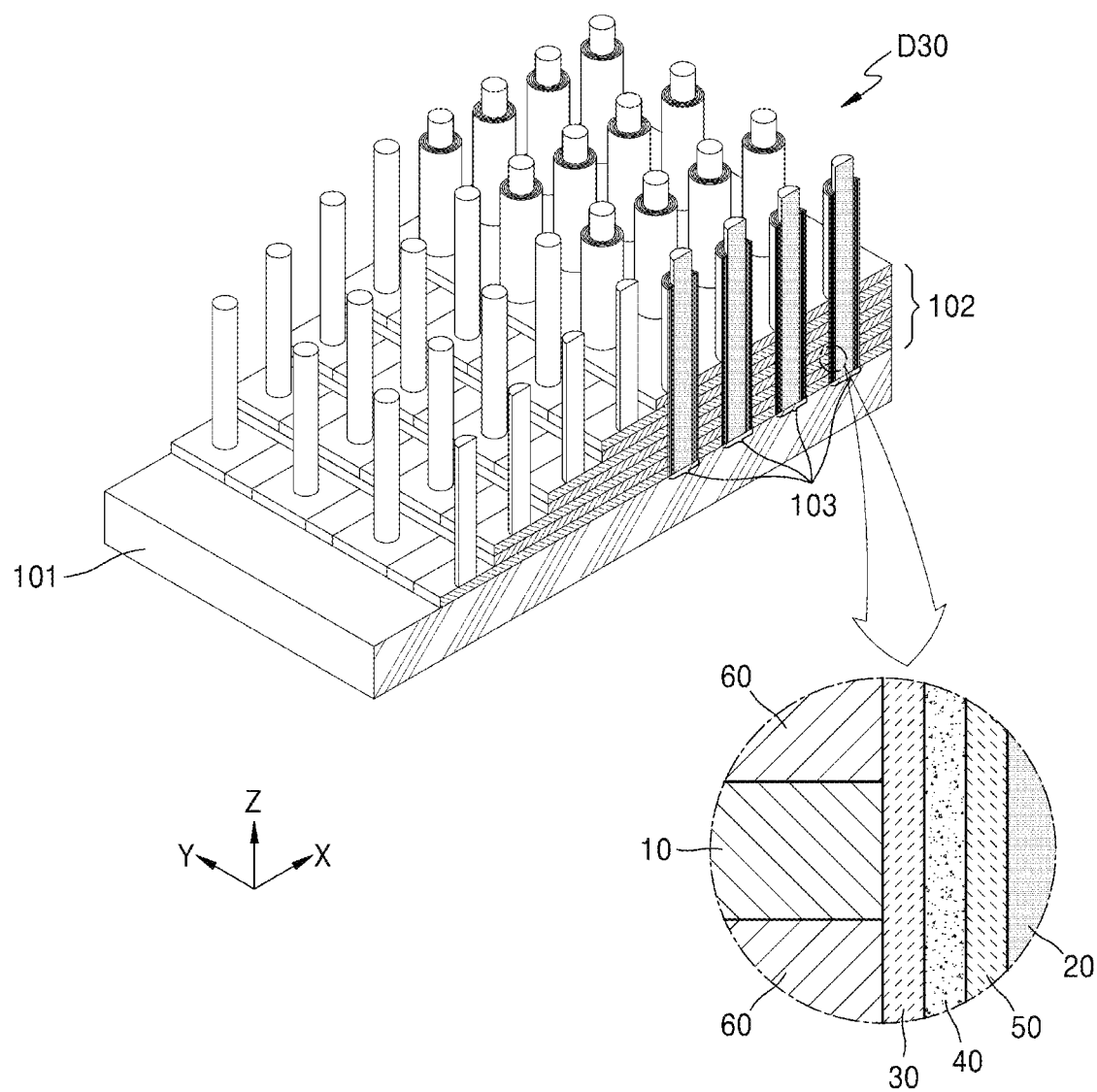
FIG. 7 is a schematic view of a semiconductor apparatus according to some example embodiments.

FIG. 7 is a schematic view of a semiconductor apparatus according to some example embodiments.

Referring to FIG. 7, a semiconductor apparatus D30 may have a stack structure 102 in which a plurality of insulating layers 60 and a plurality of first electrodes 10 are alternately and repeatedly stacked, and the ferroelectric layer 30, the conductive metal oxide layer 40, the semiconductor layer 50, and the second electrode 20 may be arranged to penetrate the stack structure 102. In detail, the insulating layers 60 and the first electrodes 10 each may extend on the substrate 101 along an X-Y plane, and the insulating layers 60 and the first electrodes 10 are alternately and repeatedly stacked in the Z direction (e.g., vertical direction), thereby forming the stack structure 102. Furthermore, the semiconductor apparatus D30 may include a cell string 103 that includes the ferroelectric layer 30, the conductive metal oxide layer 40, the semiconductor layer 50, and the second electrode 20, and the cell string 103 may be arranged to penetrate the stack structure 102 (e.g., in the Z direction, or vertical direction). In other words, the insulating layers 60 and the first electrodes 10 may be arranged to surround the periphery of the cell string 103. In detail, the ferroelectric layer 30, the conductive metal oxide layer 40, the semiconductor layer 50, and the second electrode 20 all may extend in the Z direction through the stack structure to intersect the insulating layers 60 and the first electrodes 10. Furthermore, the second electrode 20 may be arranged in the center of the cell string 103, and the ferroelectric layer 30, the conductive metal oxide layer 40, and the semiconductor layer 50 may be arranged to surround (e.g., concentrically surround as shown in FIG. 7) the second electrode 20. The conductive metal oxide layer 40 may be arranged between the ferroelectric layer 30 and the semiconductor layer 50. The semiconductor apparatus D30 may include a plurality of cell strings as the cell string 103, and the cell strings 103 may be arranged spaced apart from each other (e.g., isolated from direct contact with each other) on the X-Y plane (e.g., plane of the stack structure) in a two dimension (e.g., along a plane of the stack structure as shown in FIG. 7, wherein the vertical direction or Z direction is perpendicular to the plane of the stack structure, or X-Y plane).

A semiconductor device including a semiconductor layer and a ferroelectric layer, and a semiconductor apparatus including the semiconductor device, may be provided. The semiconductor device may be capable of low power driving, may implement an increased degree of integration, and may contribute to miniaturization of an electronic apparatus (also referred to herein interchangeably as an electronic device).

Figure 8:
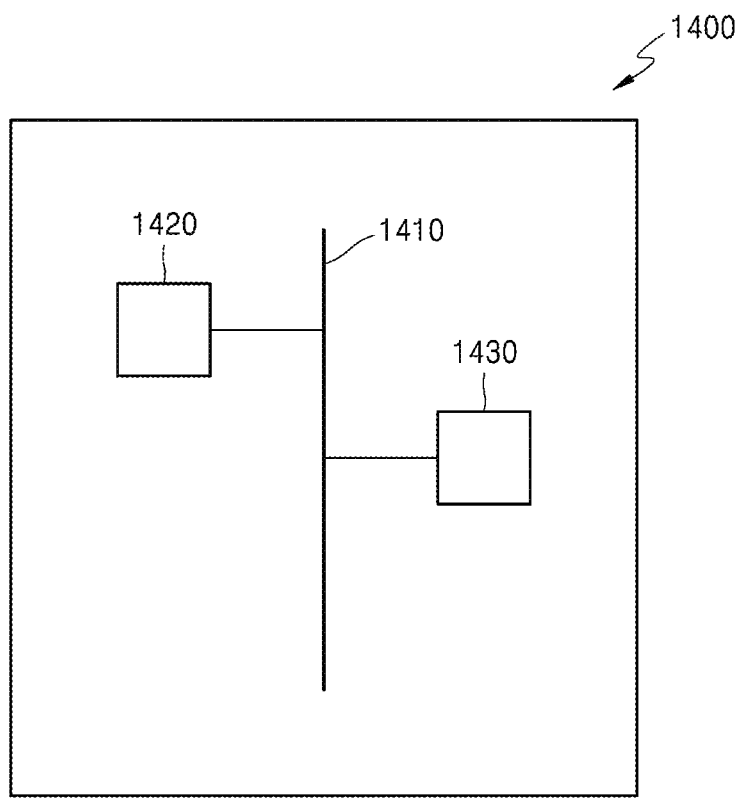
FIG. 8 shows a schematic of an electronic device according to some example embodiments.

FIG. 8 shows a schematic of an electronic device according to some example embodiments.

Referring to FIG. 8, an electronic device 1400 may include one or more electronic device components, including a processor 1420 and a memory 1430 that are communicatively coupled together via a bus 1410. The electronic device 1400 may be referred to herein as an "electronic apparatus."

The processor 1420, may be included in, may include, and/or may be implemented by one or more instances of processing circuitry such as hardware including logic circuits, a hardware/software combination such as a processor executing software; or a combination thereof. For example, the processor 1420 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1430 may include a non-transitory computer readable storage device, for example a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM), a solid state drive (SSD), or the like. The memory 1430 may store a program of instructions, and the processor 1420 may be configured to execute the program of instructions to implement the functionality of the electronic device 1400.

In some example embodiments, the electronic device 1400 (e.g., "electronic apparatus") may include a semiconductor device and/or semiconductor apparatus according to any of the example embodiments, in one or more of the processor 1420 or the memory 1430. As a result, the electronic device 1400 may be capable of low power driving (e.g., improved power efficiency and/or operational efficiency), have an increased degree of integration and may have improved miniaturization (e.g., increased compactness).

It should be understood that example embodiments described herein should be considered in a descriptive sense only and not for purposes of limitation. Descriptions of features or aspects within each example embodiment should typically be considered as available for other similar features or aspects in other example embodiments. While some example embodiments have been described with reference to the figures, it will be understood by those of ordinary skill in the art that various changes in form and details may be made therein without departing from the spirit and scope as defined by the following claims.

What is claimed is:

1. A semiconductor device, comprising:
a first electrode;
a second electrode isolated from direct contact with the first electrode;
a ferroelectric layer;
a conductive metal oxide layer; and
a semiconductor layer,
wherein the ferroelectric layer, the conductive metal oxide layer, and the semiconductor layer are between the first electrode and the second electrode, and
wherein a difference in lattice constant between the conductive metal oxide layer and the ferroelectric layer is equal to or less than 10%.

2. The semiconductor device of claim 1, wherein
the semiconductor device is configured to control a polarization direction of a polarization of the ferroelectric layer according to a direction of an electric field formed between the first electrode and the second electrode, and
the semiconductor device is further configured to form a depletion region or an accumulation region in the semiconductor layer according to the polarization direction of the polarization of the ferroelectric layer.

3. The semiconductor device of claim 1, wherein the conductive metal oxide layer include one or more materials selected from the group consisting of an indium oxide, a zinc oxide, a tin oxide, and any combination thereof.

4. The semiconductor device of claim 1, wherein the conductive metal oxide layer has an electrical conductivity equal to or greater than about 100 S/cm.

5. The semiconductor device of claim 1, wherein the conductive metal oxide layer has a crystal structure having a (111) and/or (001) crystal direction.

6. The semiconductor device of claim 1, wherein the semiconductor layer includes one or more materials selected from the group consisting of Group III-V compound semiconductors, organic semiconductors, metal oxide semiconductors, two-dimensional materials, transition metal dichalcogenides, and quantum dots.

7. The semiconductor device of claim 1, wherein the semiconductor layer has an energy bandgap equal to or less than about 5.0 eV.

8. The semiconductor device of claim 1, wherein the ferroelectric layer includes, as a base material, a material represented by $MO_2$, where M is Hf, Zr, or a combination thereof.

9. The semiconductor device of claim 1, wherein the ferroelectric layer includes, as a base material, a material represented by MO₂, where M is Hf, Zr, or a combination thereof, and the ferroelectric layer further includes a dopant material including one or more materials selected from the group consisting of C, Ge, Sn, Y, La, Gd, Mg, Ca, Sr, Hf, and any combination thereof.

10. The semiconductor device of claim 1, wherein the ferroelectric layer includes an orthorhombic crystal phase.

11. The semiconductor device of claim 1, wherein the ferroelectric layer has a crystal structure having a (111) and/or (001) crystal direction.

12. The semiconductor device of claim 1, wherein the ferroelectric layer, the conductive metal oxide layer, and the semiconductor layer each include a metal oxide.

13. The semiconductor device of claim 1, wherein the ferroelectric layer, the conductive metal oxide layer, and the semiconductor layer each independently have a thickness between about 0.1 nm and about 20 nm.

14. The semiconductor device of claim 1, wherein the semiconductor device is configured to have a variable resistance between a high resistance value and a low resistance value that is generated according to a polarization direction of a polarization of the ferroelectric layer, the semiconductor device having a resistance ratio is a ratio of the high resistance value and the low resistance value, the resistance ratio being 5.0 or more.

15. The semiconductor device of claim 1, wherein the first electrode, the second electrode, or both the first and second electrodes comprise a metal, a metal nitride, a metal oxide, or any combination thereof.

16. The semiconductor device of claim 1, further comprising:
a memory element that is configured to store information.

17. A semiconductor apparatus, comprising:
a plurality of first electrode lines on a substrate, the plurality of first electrode lines extending in parallel to an upper surface of the substrate, the plurality of first electrode lines extending in a first direction;
a plurality of second electrode lines on the plurality of first electrode lines, the plurality of second electrode lines extending in parallel to the upper surface of the substrate, the plurality of second electrode lines extending in a second direction that is different from the first direction; and
a first semiconductor device between the plurality of first electrode lines and the plurality of second electrode lines at an intersection of one of the plurality of first electrode lines and one of the plurality of second electrode lines where the one of the plurality of first electrode lines and the one of the plurality of second electrode lines overlap each other in a vertical direction that is perpendicular to the first direction and is perpendicular to the second direction, the first semiconductor device comprising the semiconductor device according to claim 1.

18. The semiconductor apparatus of claim 17, further comprising:
a plurality of third electrode lines on the plurality of first electrode lines and the plurality of second electrode lines, the plurality of third electrode lines extending in the first direction; and
a second semiconductor device between the plurality of second electrode lines and the plurality of third electrode lines at an intersection of the one of the plurality of second electrode lines and one of the plurality of third electrode lines where the one of the plurality of second electrode lines and the one of the plurality of third electrode lines overlap each other in the vertical direction, the second semiconductor device having a same structure as the first semiconductor device.

19. A semiconductor apparatus, comprising:
a stack structure in which a plurality of insulating layers and a plurality of first electrodes are alternately and repeatedly stacked in a vertical direction; and
a cell string including a ferroelectric layer, a conductive metal oxide layer, a semiconductor layer, and a second electrode,
wherein the cell string penetrates the stack structure in the vertical direction,
wherein, in the cell string, the ferroelectric layer, the conductive metal oxide layer, and the semiconductor layer are between a first electrode of the plurality of first electrodes and the second electrode, and
wherein a difference in lattice constant between the conductive metal oxide layer and the ferroelectric layer is equal to or less than 10%.

20. The semiconductor apparatus of claim 19, wherein the ferroelectric layer, the conductive metal oxide layer, the semiconductor layer, and the second electrode extend in the vertical direction through the stack structure, and
the second electrode is at a center portion of the cell string, and the ferroelectric layer, the conductive metal oxide layer, and the semiconductor layer concentrically surround the second electrode.

21. The semiconductor apparatus of claim 19, wherein the cell string includes a plurality of cell strings isolated from direct contact with each other along a plane of the stack structure, wherein the vertical direction is perpendicular to the plane of the stack structure.

22. An electronic device, comprising the semiconductor device of claim 1.

23. An electronic device, comprising the semiconductor apparatus of claim 19.

24. A semiconductor device, comprising:
a memory element that is configured to store information, the memory element including a ferroelectric layer;
a selection element electrically connected to the memory element, the selection element configured to perform selection of the semiconductor device based on controlling a flow of an electric current through the memory element, the selection element including a semiconductor layer; and
a conductive metal oxide layer,
wherein the ferroelectric layer and the semiconductor layer are coupled to each other between two electrodes, and no terminals are between the ferroelectric layer and the semiconductor layer, and wherein a difference in lattice constant between the conductive metal oxide layer and the ferroelectric layer is equal to or less than 10%.

25. An electronic device, comprising the semiconductor device of claim 24.

* * * * *